United States Patent
Ross et al.

(10) Patent No.: US 10,145,986 B2
(45) Date of Patent: Dec. 4, 2018

(54) MODELLING COMPLEX GEOLOGICAL SEQUENCES USING GEOLOGIC RULES AND PALEOGRAPHIC MAPS

(71) Applicant: Landmark Graphics Corporation, Houston, TX (US)

(72) Inventors: William Clayton Ross, Littleton, CO (US); Kieran Bowen, Oxford (GB)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 15/323,789

(22) PCT Filed: Nov. 9, 2015

(86) PCT No.: PCT/US2015/059687
§ 371 (c)(1),
(2) Date: Jan. 4, 2017

(87) PCT Pub. No.: WO2017/082856
PCT Pub. Date: May 18, 2017

(65) Prior Publication Data
US 2017/0315265 A1   Nov. 2, 2017

(51) Int. Cl.
*G06G 7/48* (2006.01)
*G01V 99/00* (2009.01)
*G01V 1/30* (2006.01)
*G06F 17/50* (2006.01)

(52) U.S. Cl.
CPC ............ *G01V 99/005* (2013.01); *G01V 1/302* (2013.01); *G06F 17/5009* (2013.01); *G01V 2210/64* (2013.01)

(58) Field of Classification Search
CPC .................................................... G01V 99/005
USPC .......................................................... 703/10
See application file for complete search history.

(56) References Cited

U.S. PATENT DOCUMENTS

| | | | |
|---|---|---|---|
| 8,271,244 B2* | 9/2012 | Ross | G01V 99/005 703/6 |
| 2011/0320182 A1 | 12/2011 | Donmisse et al. | |
| 2013/0064040 A1 | 3/2013 | Imhof et al. | |
| 2013/0297274 A1 | 11/2013 | Yarus et al. | |
| 2014/0278311 A1 | 9/2014 | Dimitrov et al. | |
| 2015/0066460 A1 | 3/2015 | Klinger et al. | |

OTHER PUBLICATIONS

Written Opinion of the ISA for International Application No. PCT/US2015/059687 dated Jul. 26, 2016, 5 pages.

Mallet, Jean Laurent, Space-Time Mathematical Framework for Sedimentary Geology, Mathematical Geology, vol. 36, No. 1m Jan. 2004, 32 pages.

Qayyum, Farrukh et al., Historical Developments in Wheeler Diagrams and Future Directions, Basin Research (2014) 26, 1-15, dot: 10.111/bre.120477, 15 pages.

\* cited by examiner

*Primary Examiner* — Hugh Jones
(74) *Attorney, Agent, or Firm* — Polsinelli PC

(57) ABSTRACT

Systems and methods for modelling complex geological sequences representing new actual surfaces within a gross interval thickness using geologic rules based on facies data and paleographic maps represented by MRS shoreline facies.

20 Claims, 3 Drawing Sheets

MODELLING COMPLEX GEOLOGICAL SEQUENCES USING GEOLOGIC RULES AND PALEOGRAPHIC MAPS

This application claims the priority of PCT Patent Application No. PCT/US15/59687, filed on Nov. 9, 2015, which is incorporated herein by reference.

FIELD OF THE DISCLOSURE

The present disclosure generally relates to systems and methods for modelling complex geological sequences using geologic rules and paleographic maps. More particularly, the present disclosure relates to modelling complex geological sequences representing new actual surfaces within a gross interval thickness using geologic rules based on facies data and paleographic maps represented by MRS shoreline facies.

BACKGROUND

Modelling complex geological sequences may utilize conventional techniques such as, for example, proportional layering to create stratigraphic subdivisions between grids that represent a more detailed layering of the earth. This technique assumes a parallel and conformable geometric pattern for a gross interval thickness, which is the difference between two gridded surfaces. The gross interval thickness may be appropriate for certain portions of an overall depositional sequence (i.e., the top-set and bottom-set portions), but is inappropriate for the pro-grading, clinoform-dominated portions of the depositional sequence.

Another conventional technique for modelling complex geological sequences uses proportions and flattens all stratigraphic layers in geologic time in an attempt to restore the subsurface model into a chronostratigraphic model. In doing this, a mathematical technique is applied for proportional layering across the subsurface model. This type of proportional layering technique has limited use when the goal is to model the entire depositional sequence (i.e., for areas with pro-gradational clinoforms that cannot be modeled using conventional approaches to proportional layering).

Related techniques for modelling complex geological sequences may use automated seismic horizon tracking and model-building to create 3D subsurface models that can be translated into a chronostratigraphic model. The 3D subsurface model is created by direct interpretation of seismic data. In other words, the 3D subsurface model is derived directly from densely sampled seismic data. This technique extracts time-stratigraphic surfaces from seismic data (using coherence attributes) to build a time-stratigraphic 3D subsurface model. Then, the constructed 3D subsurface model is translated into a chronostratigraphic model. This approach can work when available seismic data has a high signal-to-noise ratio. However, in regions of poor quality seismic data, building with this technique is impossible.

BRIEF DESCRIPTION OF THE DRAWINGS

The present disclosure is described below with references to the accompanying drawings in which like elements are referenced with like reference numerals, and in which.

DETAILED DESCRIPTION OF THE PREFERRED EMBODIMENTS

Figure 1:
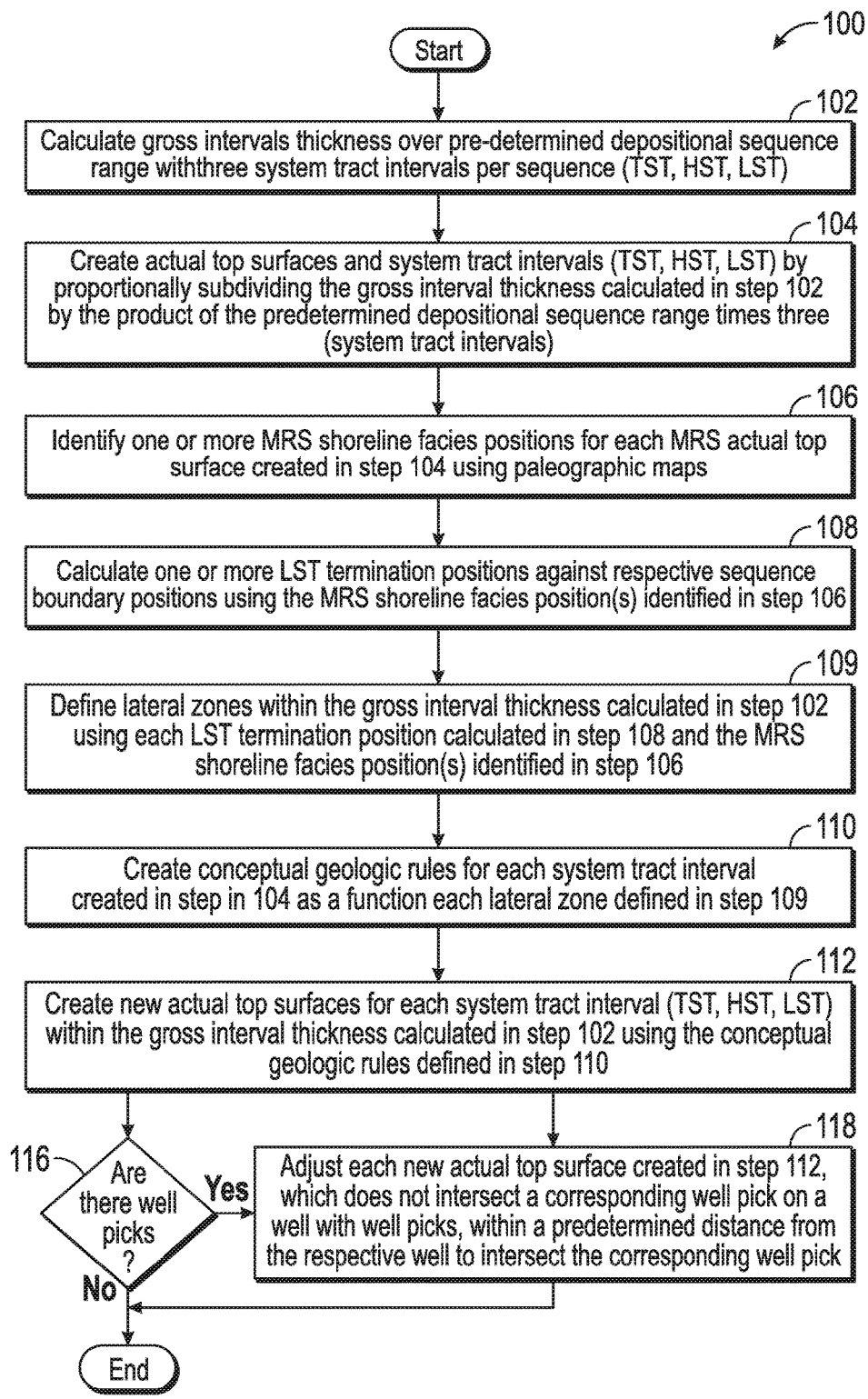
FIG. 1 is a flow diagram illustrating one embodiment of a method for implementing the present disclosure.

The present disclosure overcomes one or more deficiencies in the prior art by providing systems and methods for modelling complex geological sequences representing new actual surfaces within a gross interval thickness using geologic rules based on facies data and paleographic maps represented by MRS shoreline facies.

In one embodiment, the present disclosure includes a method for modelling complex geological sequences, which comprises: i) identifying an MRS shoreline facies position for each actual top surface that is an MRS actual top surface using a paleographic map; ii) calculating one or more LST termination positions against a respective sequence boundary position using a respective MRS shoreline facies position and a computer processor; iii) defining lateral zones within a gross interval thickness using each LST termination position and each MRS shoreline facies position; iv) creating conceptual geologic rules for each system tract interval as a function of each lateral zone; and v) creating new actual top surfaces for each system tract interval within the gross interval thickness using the conceptual geological rules.

In another embodiment, the present disclosure includes a non-transitory program carrier device tangibly carrying computer executable instructions for modelling complex geological sequences, the instructions being executable to implement: i) identifying an MRS shoreline facies position for each actual top surface that is an MRS actual top surface using a paleographic map; ii) calculating one or more LST termination positions against a respective sequence boundary position using a respective MRS shoreline facies position; iii) defining lateral zones within a gross interval thickness using each LST termination position and each MRS shoreline facies position; iv) creating conceptual geologic rules for each system tract interval as a function of each lateral zone; and v) creating new actual top surfaces for each system tract interval within the gross interval thickness using the conceptual geological rules.

In yet another embodiment, the present disclosure includes a non-transitory program carrier device tangibly carrying computer executable instructions for modelling complex geological sequences, the instructions being executable to implement: i) identifying an MRS shoreline facies position for each actual top surface that is an MRS actual top surface; ii) calculating one or more LST termination positions against a respective sequence boundary position using a respective MRS shoreline facies position; iii) defining lateral zones within a gross interval thickness using each LST termination position and each MRS shoreline facies position; iv) creating conceptual geologic rules for each system tract interval as a function of each lateral zone; v) creating new actual top surfaces for each system tract interval within the gross interval thickness using the conceptual geological rules; and vi) calculating the gross interval thickness over a predetermined depositional sequence range with a predetermined number of system tract intervals per sequence.

The subject matter of the present disclosure is described with specificity, however, the description itself is not intended to limit the scope of the disclosure. The subject matter thus, might also be embodied in other ways, to include different structures, steps and/or combinations similar to those described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be described with respect to the oil and gas industry, it is not limited thereto and may also be applied in other industries (e.g. drilling water wells) to achieve similar results.

Method Description

Referring now to FIG. 1, a flow diagram illustrates one embodiment of a method 100 for implementing the present disclosure. The method 100 enables proportional or stratigraphic subdivisions across the entire depositional sequence to build a 3D model of depositional sequences using sparse data. Distinctive features of the method 100 include: 1) the use of facies data (paleo shorelines and shelf edges) as a means of guiding geologic rules for 3D sequence modeling; and 2) the use of proportionality as a means of carrying or describing the geologic rules.

In step 102, a gross interval thickness over a predetermined depositional sequence range with three system tract intervals per sequence (TST, HST, LST) is calculated using a predetermined gross interval defined by two grids representing seismic horizons or well tops (derived from seismic data retrieved from sensors) and techniques well known in the art. TST is the transgressive systems tract, HST is the highstand systems tract, and LST is the lowstand systems tract. MFS is the maximum flooding surface, which is the top of the TST. The SB is the sequence boundary, which is the top of the HST. And MRS is the maximum regressive surface, which is the top of the LST.

Figure 2:
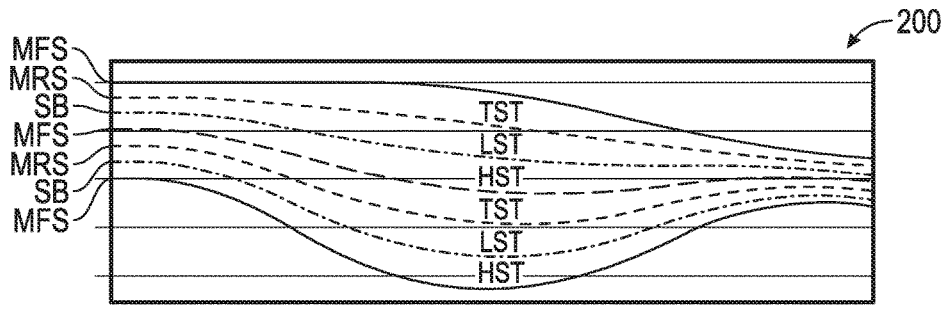
FIG. 2 is a system tract interval diagram illustrating step 104 in FIG. 1.

In step 104, actual top surfaces and system tract intervals (TST, HST, LST) are created by proportionally subdividing the gross interval thickness calculated in step 102 by the product of the predetermined depositional sequence range (i.e., how many sequences) times three (system tract intervals). Each system tract interval lies between the actual top surface (MFS, MRS, SB) and an actual bottom surface. In FIG. 2, a system tract interval diagram 200 illustrates the system tract intervals (TST, HST, LST) and their respective actual top surfaces (MFS, SB, MRS) within an exemplary gross interval thickness and a predetermined depositional sequence range of two (2).

In step 106, one or more MRS shoreline facies positions are identified for each MRS actual top surface created in step 104 using paleographic maps and techniques well known in the art.

Figure 3:
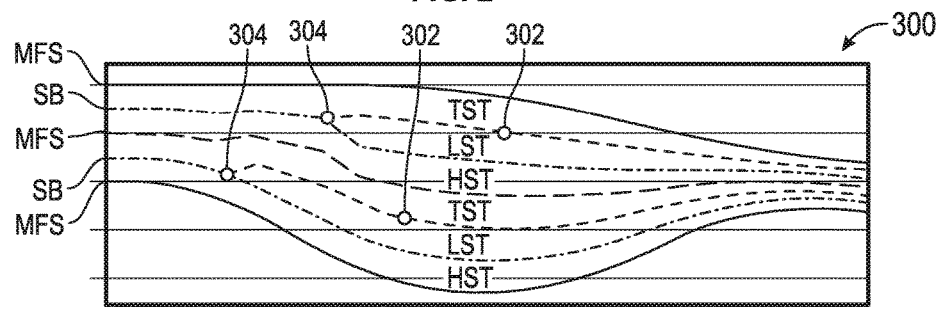
FIG. 3 is a system tract interval diagram illustrating step 108 in FIG. 1.

In step 108, one or more LST termination positions are calculated against respective sequence boundary positions using the MRS shoreline facies positions identified in step 106. Each termination position is calculated as a predetermined distance (e.g., 10 kilometers) landward of a respective MRS shoreline facies position. The predetermined distance can vary. Each termination position determines the up-dip limit of the LST system tract interval, which is the position whereby the proportional thickness of the LST system tract interval is known to be zero. In FIG. 3, a system tract interval diagram 300 illustrates the system tract intervals (TST, HST, LST) and their respective actual top surfaces (MFS, SB, MRS) in FIG. 2 with the MRS shoreline facies positions 302 and the LST termination positions 304.

Figure 4:
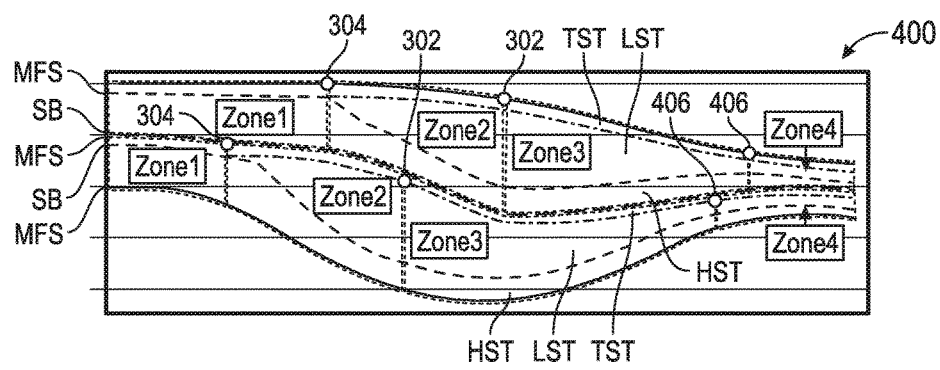
FIG. 4 is a system tract interval diagram illustrating step 109 in FIG. 1.

In step 109, lateral zones are defined within the gross interval thickness calculated in step 102 using each LST termination position calculated in step 108 and each MRS shoreline facies position identified in step 106. In FIG. 4, a system tract interval diagram 400 illustrates exemplary lateral zones for the system tract interval diagram 300 in FIG. 3. For a given depositional sequence, each zone 1 is updip of an LST termination position 304, each zone 2 is between an LST termination position 304 and an MRS shoreline facies position 302, each zone 3 is between an MRS shoreline facies position 302 and a toe of slope (TOS) position 406 and each zone 4 is seaward of the TOS positions 406. The TOS positions represent the transition from slope to basinal facies and are determined as a function of surface slope.

In step 110, different conceptual geologic rules are created for each system tract interval created in step 104 as a function of each lateral zone defined in step 109. The conceptual geologic rules generally fit the pattern of systems tract interval proportional thicknesses observed for depositional sequences across the globe. The following conceptual geologic rules are established for depositional sequence fill patterns (geometries and thickening and thinning patterns), which can be translated into formal mathematical calculations:

In zones 1 and 4, the rules reflect system tract intervals that maintain a parallel relationship to one another. In zones 2 and 3, the rules reflect rapid thickness changes that correspond to slope deposition;

The TST generally thins into the basin;

HST and LST have a negative proportional relationship—as one gets thicker, the other gets thinner;

The LST has its maximum absolute thickness at the MRS shoreline facies position and/or shelf edge;

The LST thins from the MRS shoreline facies position to the LST termination position; and The LST thins from the MRS shoreline facies position to the TOS.

These rules may be put into the form of proportionality ratios per system tract interval per dip position and controlled by position relative to LST termination positions, MRS shoreline facies positions and TOS positions. For example, simple ratios-of-thicknesses for intervals in the deep portion of the basin could assume: LST is 4 times as thick as TST, whereas the HST is 2 times as thick as the TST.

Figure 5:
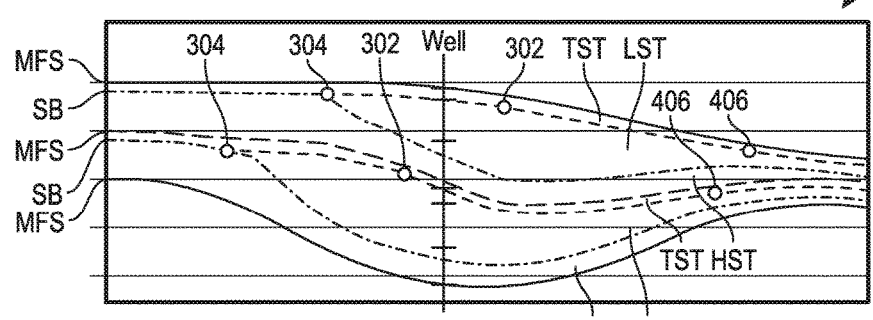
FIG. 5 is a system tract interval diagram illustrating step 112 in FIG. 1.

In step 112, new actual top surfaces for each system tract interval (TST, HST, LST) are created within the gross interval thickness calculated in step 102 using the conceptual geologic rule(s) defined in step 110. The creation of the new actual top surfaces for each system tract interval may be illustrated by tables 1 and 2 below. Each column in tables 1 and 2 represents a different dip position across the basin profile (columns 1-17) from landward positions on the left to seaward positions on the right. The LST termination positions, MRS shoreline facies positions and TOS positions for two complete sequences, which are used to define the lateral zones in FIG. 4, are labeled across the top. In column 1 of table 1, for example, an up-dip location includes two TST and two HST system tract intervals (there are no LST system tract intervals up-dip). The conceptual geologic rule created in step 110 (e.g. HST thickness is 2 times the TST thickness) for these system tract intervals is represented in rows 1-6 of column 1 as the proportionality ratio, wherein the LST system tract interval proportionality ratio is zero. Using the gross interval thickness (100 meters in column 1) calculated in step 102 and the conceptual geologic rule created in step 110, the proportionality variable may be calculated by solving for X in the following equation: $100=2((2X \text{ (HST)})+2((1X \text{ (TST)})$ or $100=4X+2X$ wherein $X=16.67$. The product of the proportionality variable (16.67) times the proportionality ratio (rows 1-6) yields each system tract interval thickness. The TST and HST system tract interval thicknesses are thus, 16.67 meters and 33.34 meters, respectively. The new actual top surfaces for each system tract interval are thus, created by summing the interval thickness calculations for a given system tract interval at each dip location across the entire basin (columns 1-17). Table 2 includes the new actual top surfaces (depths as negative numbers) created for each system tract interval across the entire basin. In column 17 of table 1, as another example, a far down-dip location includes two TST, two HST and two LST system tract intervals. The conceptual geologic rule created in step 110 (e.g. LST thickness is 4 times TST thicknesses and HST thickness is 2 times TST thickness) for these system tract intervals is represented in rows 1-6 of column 17 as the proportionality ratio, wherein the LST system tract interval proportionality ratio is four. Using the gross interval thickness (100 meters in column 17) calculated in step 102 and the conceptual geologic rule created in step 110, the proportionality variable may be calculated by solving for X in the following equation: $100=2((4X \text{ (LST)})+2(2X \text{ (HST)})+2(1X \text{ (TST)})$ or $100=8X+4X+2X$ wherein $X=7.1$. The product of the proportionality variable (7.1) times the proportionality ratio (rows 1-6) yields each system tract interval thickness. The LST, HST and TST system tract interval thicknesses are thus, 56.8 meters, 28.4 meters and 14.2 meters, respectively. The new actual top surfaces for each system tract interval are thus, created by summing the interval thickness calculations for a given system tract interval at each dip location across the entire basin (columns 1-17). Table 2 includes the new actual top surfaces (depths as negative numbers) created for each system tract interval across the entire basin. In FIG. 5, a system tract interval diagram 500 illustrates exemplary new actual top surfaces for each system tract interval (TST, HST, LST) compared to the actual top surfaces in FIG. 2. A new well has been added with well picks (cross-marks), which represent correlations to top surfaces. When a new well is added, there is likely to be a difference between the new actual surfaces and the well picks.

TABLE 1

Systems Tract Interval Proportions

| Rows | Surfaces | System Tract Intervals | Landward | | LST1 TP | | MRS1 FP | LST2 TP | Numbers Shown below in rows 1-6 are Proportion Ratios |
|---|---|---|---|---|---|---|---|---|---|
| 1 | MFS2 | TST | 1 | 1 | 1 | 1 | 1 | 1 | 1 | 1 |
| 2 | MRS2 | LST | 0 | 0 | 0 | 0 | 0 | 0 | 0 | 2 |
| 3 | SB2 | HST | 2 | 2 | 2 | 2 | 2 | 2 | 2.2 | 1.5 |
| 4 | MFS1 | TST | 1 | 1 | 1 | 1 | 1 | 1 | 1 | 1 |
| 5 | MRS1 | LST | 0 | 0 | 0 | 0 | 2 | 5 | 4.8 | 4.2 |
| 6 | SB1 | HST | 2 | 2 | 2.5 | 3 | 3 | 2.2 | 2 | 1.9 |
| 7 | MFS0 | | | | | | | | | |
| 8 | | Proportionality Variable = | 16.67 | 16.7 | 18.5 | 18.6 | 17.8 | 17.0 | 18.2 | 17.2 |
| 9 | | Total Gross Interval (m) | 100 | 100 | 120 | 130 | 160 | 190 | 200 | 200 |
| 10 | | Column # | 1 | 2 | 3 | 4 | 5 | 6 | 7 | 8 |

| Rows | MRS1 - TOS | | | MPS2 FP | | | MRS2 - TOS | | Seaward | Numbers Shown below in rows 1-6 are Proportion Ratios |
|---|---|---|---|---|---|---|---|---|---|---|
| 1 | 1 | 1 | 1 | 1 | 1 | 1 | 1 | 1 | 1 | |
| 2 | 3.3 | 3.4 | 4.4 | 4.5 | 4.4 | 4.3 | 4.2 | 4.1 | 4 | |
| 3 | 1.5 | 1.4 | 1.4 | 1.4 | 1.4 | 1.3 | 1.2 | 1.1 | 2 | |
| 4 | 1 | 1 | 1 | 1 | 1 | 1 | 1 | 1 | 1 | |
| 5 | 4.1 | 4.1 | 4.1 | 4.1 | 4.1 | 4.1 | 4.1 | 4.1 | 4 | |
| 6 | 1.8 | 1.7 | 1.6 | 1.5 | 1.4 | 1.5 | 1.5 | 1.8 | 2 | |
| 7 | | | | | | | | | | |
| 8 | 15.7 | 15.9 | 14.8 | 14.8 | 13.5 | 12.3 | 10.8 | 9.2 | 7.1 | |
| 9 | 200 | 200 | 200 | 200 | 180 | 160 | 140 | 120 | 100 | |
| 10 | 9 | 10 | 11 | 12 | 13 | 14 | 15 | 16 | 17 | |

TABLE 2

Interval Top Surface Depths

| Rows | Surfaces | System Tract Intervals | Landward 0 | 0 | 0 | LST1 TP 0 | 0 | MRS1 FP 0 | LST2 TP 0 | −3 | MRS1 - TOS −9 |
|---|---|---|---|---|---|---|---|---|---|---|---|
| 1 | MFS2 | TST | −16.67 | −16.67 | −18.46 | −18.57 | −17.78 | −16.96 | −18.18 | −20.24 | −24.75 |
| 2 | MRS2 | LST | −16.7 | −16.7 | −18.5 | −18.6 | −17.8 | −17.0 | −18.2 | −54.7 | −76.7 |
| 3 | SB2 | HST | −50.0 | −50.0 | −55.4 | −55.7 | −53.3 | −50.9 | −58.2 | −80.6 | −100.3 |
| 4 | MFS1 | TST | −66.7 | −66.7 | −73.8 | −74.3 | −71.1 | −67.9 | −76.4 | −97.8 | −116.1 |
| 5 | MRS1 | LST | −66.7 | −66.7 | −73.8 | −74.3 | −106.7 | −152.7 | −163.6 | −170.2 | −180.7 |
| 6 | SB1 | HST | −100.0 | −100.0 | −120.0 | −130.0 | −160.0 | −190.0 | −200.0 | −203.0 | −209.0 |
| 7 | MFS0 | | | | | | | | | | |
| 8 | | Column # | 1 | 2 | 3 | 4 | 5 | 6 | 7 | 8 | 9 |

| Rows | −10 | −12 | MPS2 FP −16 | −25 | −40 | MKS2 - TOS −55 | −70 | Seaward −80 |
|---|---|---|---|---|---|---|---|---|
| 1 | −25.87 | −26.81 | −30.81 | −38.53 | −52.31 | −65.77 | −79.16 | −87.14 |
| 2 | −79.8 | −92.0 | −97.5 | −98.1 | −105.2 | −111.0 | −116.7 | −115.7 |
| 3 | −102.1 | −112.7 | −118.2 | −117.0 | −121.2 | −123.9 | −126.8 | −130.0 |
| 4 | −117.9 | −127.6 | −133.0 | −130.6 | −133.5 | −134.7 | −136.0 | −137.1 |
| 5 | −183.0 | −188.3 | −193.8 | −186.1 | −184.0 | −178.8 | −173.5 | −165.7 |
| 6 | −210.0 | −212.0 | −216.0 | −205.0 | −200.0 | −195.0 | −190.0 | −180.0 |
| 7 | | | | | | | | |
| 8 | 10 | 11 | 12 | 13 | 14 | 15 | 16 | 17 |

In step 116, the method 100 determines if there are any well picks for each well in the gross interval thickness calculated in step 102. If there is no well pick for each well, then the method 100 ends. Otherwise, the method 100 proceeds to step 118.

Figure 6:
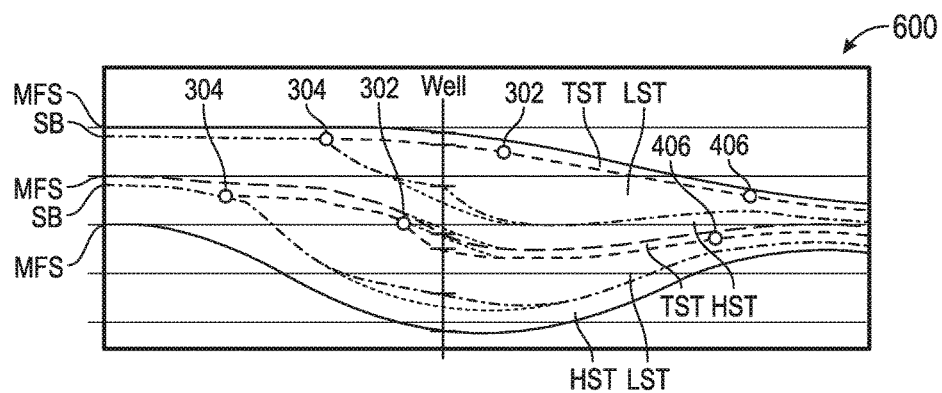
FIG. 6 is a system tract interval diagram illustrating step 118 in FIG. 1.

In step 118, each new actual top surface created in step 112 that does not intersect a corresponding well pick on a well with well picks is adjusted within a predetermined distance from the respective well to intersect the corresponding well pick. The method 100 may end or repeat from step 116 if any well position is moved or a new well is added. In FIG. 6, a system tract interval diagram 600 illustrates the four new actual top surfaces (SB, MFS, MRS, SB) in FIG. 5 that are adjusted within a predetermined distance from the respective well to intersect the corresponding well pick.

The method 100 enables modeling sequence geometries from sparse data and provides a technique for modeling basin fill geometries and then associating additional properties with them (e.g., additional facies and rock properties data). These models can be updated to honor specific inputs from well control. The method 100 thus, improves stratigraphic prediction in order to more accurately determine well positioning.

System Description

The present disclosure may be implemented through a computer-executable program of instructions, such as program modules, generally referred to as software applications or application programs executed by a computer. The software may include, for example, routines, programs, objects, components and data structures that perform particular tasks or implement particular abstract data types. The software forms an interface to allow a computer to react according to a source of input. DecisionSpace®, which is a commercial software application marketed by Landmark Graphics Corporation, may be used as an interface application to implement the present disclosure. The software may also cooperate with other code segments to initiate a variety of tasks in response to data received in conjunction with the source of the received data. The software may be stored and/or carried on any variety of memory such as CD-ROM, magnetic disk, bubble memory and semiconductor memory (e.g. various types of RAM or ROM). Furthermore, the software and its results may be transmitted over a variety of carrier media such as optical fiber, metallic wire and/or through any of a variety of networks, such as the Internet.

Moreover, those skilled in the art will appreciate that the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Figure 7:
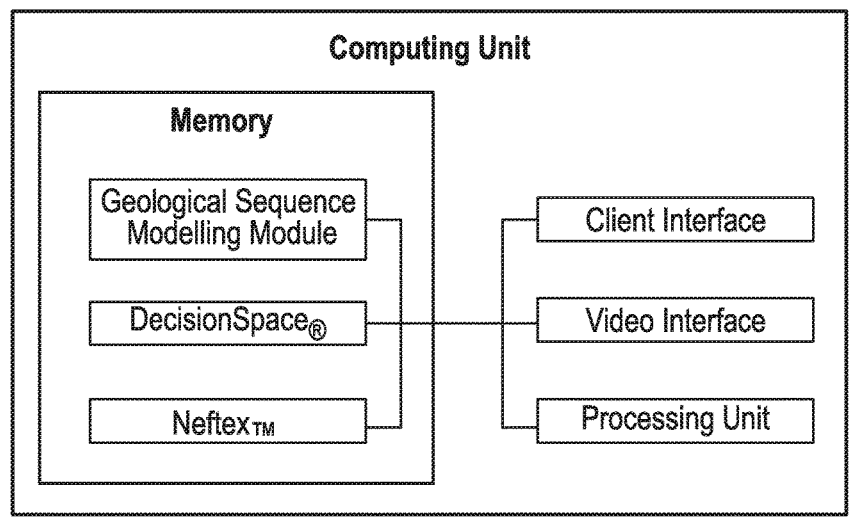
FIG. 7 is a block diagram illustrating one embodiment of a computer system for implementing the present disclosure.

Referring now to FIG. 7, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1-6. The memory therefore, includes a geological sequence modelling module, which enables steps 106-118 described in reference to FIG. 1. The geological sequence modelling module may integrate functionality from the remaining application programs illustrated in FIG. 7. In particular, DecisionSpace® may be used as an interface application to perform steps 102-104 in FIG. 1. Neftex™, which is a commercial database marketed by Landmark Graphics Corporation, may be used to supply the paleographic maps used in step 106. Although DecisionSpace® and Neftex™ may be used as interface application, other interface applications may be used, instead, or the geological sequence modelling module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well-known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A method for modelling complex geological sequences, the method comprising:
    identifying, by a computer processor, one or more MRS shoreline facies positions for each actual top surface that is an MRS actual top surface using a paleographic map;
    calculating, by the computer processor, one or more LST termination positions against a respective sequence boundary position using at least one of the one or more MRS shoreline facies positions;
    defining, by the computer processor, one or more lateral zones within a gross interval thickness using each LST termination position and each MRS shoreline facies position;
    creating, by the computer processor, one or more conceptual geologic rules for each system tract interval as a function of each lateral zone;
    creating, by the computer processor, new actual top surfaces for each system tract interval within the gross interval thickness using the conceptual geological rules;
    selecting, by the computer processor, one or more well locations based on the new actual top surfaces and the conceptual geologic rules; and
    drilling one or more wells based on the selected one or more well locations.

2. The method of claim 1, further comprising calculating the gross interval thickness over a predetermined depositional sequence range with three system tract intervals per sequence.

3. The method of claim 2, further comprising creating each actual top surface and each system tract interval by proportionally subdividing the gross interval thickness by a product of the predetermined depositional sequence range times three.

4. The method of claim 1, further comprising adjusting each new actual top surface, which does not intersect a corresponding well pick on a well with well picks, within a predetermined distance from the respective well to interest the corresponding well pick.

5. The method of claim 1, wherein four lateral zones are defined within the gross interval thickness.

6. The method of claim 5, wherein a first zone is defined updip of one of the one or more LST termination positions, a second zone is defined between one of the one or more LST termination positions and the respective MRS shoreline facies position, a third zone is defined between the respective MRS shoreline facies position and a TOS position, and a fourth zone is defined seaward of the TOS position.

7. The method of claim 6, wherein the conceptual geologic rules for each system tract interval require the first lateral zone and the fourth lateral zone to maintain a parallel relationship.

8. The method of claim 6, wherein the conceptual geologic rules for each system tract interval require the second lateral zone and the third lateral zone to reflect rapid thickness changes that correspond to slope deposition.

9. The method of claim 2, wherein the gross interval thickness is calculated using a predetermined gross interval defined by two grids representing seismic horizons or well tops derived from seismic data retrieved from sensors.

10. A non-transitory program carrier device tangibly carrying computer executable instructions for modeling complex geological sequences, the instructions being executable to implement:
   identifying, by a computer processor, one or more MRS shoreline facies positions for each actual top surface that is an MRS actual top surface using a paleographic map;
   calculating, by the computer processor, one or more LST termination positions against a respective sequence boundary position using at least one of the one or more MRS shoreline facies positions;
   defining, by the computer processor, one or more lateral zones within a gross interval thickness using each LST termination position and each MRS shoreline facies position;
   creating, by a computer processor, one or more conceptual geologic rules for each system tract interval as a function of each lateral zone;
   creating, by a computer processor, new actual top surfaces for each system tract interval within the gross interval thickness using the conceptual geological rules;
   selecting, by a computer processor, one or more well locations based on the new actual top surfaces and the conceptual geologic rules; and
   drilling one or more wells based on the selected one or more well locations.

11. The program carrier device of claim 10, further comprising calculating the gross interval thickness over a predetermined depositional sequence range with three system tract intervals per sequence.

12. The program carrier device of claim 11, further comprising creating each actual top surface and each system tract interval by proportionally subdividing the gross interval thickness by a product of the predetermined depositional sequence range times three.

13. The program carrier device of claim 10, further comprising adjusting each new actual top surface, which does not intersect a corresponding well pick on a well with well picks, within a predetermined distance from the respective well to interest the corresponding well pick.

14. The program carrier device of claim 10, wherein four lateral zones are defined within the gross interval thickness.

15. The program carrier device of claim 14, wherein a first zone is defined updip of one of the one or more LST termination positions, a second zone is defined between one of the one or more LST termination positions and the respective MRS shoreline facies position, a third zone is defined between the respective MRS shoreline facies position and a TOS position, and a fourth zone is defined seaward of the TOS position.

16. The program carrier device of claim 15, wherein the conceptual geologic rules for each system tract interval require the first lateral zone and the fourth lateral zone to maintain a parallel relationship.

17. The program carrier device of claim 15, wherein the conceptual geologic rules for each system tract interval require the second lateral zone and the third lateral zone to reflect rapid thickness changes that correspond to slope deposition.

18. The program carrier device of claim 11, wherein the gross interval thickness is calculated using a predetermined gross interval defined by two grids representing seismic horizons or well tops derived from seismic data retrieved from sensors.

19. A non-transitory program carrier device tangibly carrying computer executable instructions for modelling complex geological sequences, the instructions being executable to implement:
   identifying, by a computer processor, one or more MRS shoreline facies position for each actual top surface that is an MRS actual top surface;
   calculating, by the computer processor, one or more LST termination positions against a respective sequence boundary position using at least one of the one or more MRS shoreline facies positions;
   defining, by the computer processor, one or more lateral zones within a gross interval thickness using each LST termination position and each MRS shoreline facies position;
   creating, by the computer processor, one or more conceptual geologic rules for each system tract interval as a function of each lateral zone;
   creating, by the computer processor, new actual top surfaces for each system tract interval within the gross interval thickness using the conceptual geological rules;
   calculating, by the computer processor, the gross interval thickness over a predetermined depositional sequence range with a predetermined number of system tract intervals per sequence;
   selecting, by the computer processor, one or more well locations based on the new actual top surfaces and the conceptual geologic rules; and
   drilling one or more wells based on the selected one or more well locations.

20. The program carrier device of claim 19, further comprising creating each actual top surface and each system tract interval by proportionally subdividing the gross interval thickness by a product of the predetermined depositional sequence range times the predetermined number of system tract intervals per sequence.

* * * * *